United States Patent
Tanaka et al.

(10) Patent No.: US 7,973,456 B2
(45) Date of Patent: Jul. 5, 2011

(54) PIEZOELECTRIC CERAMIC AND PIEZOELECTRIC ELEMENT EMPLOYING IT

(75) Inventors: Daisuke Tanaka, Tokyo (JP); Masahito Furukawa, Tokyo (JP)

(73) Assignee: TDK Corporation, Tokyo (JP)

( * ) Notice: Subject to any disclaimer, the term of this patent is extended or adjusted under 35 U.S.C. 154(b) by 184 days.

(21) Appl. No.: 12/405,768

(22) Filed: Mar. 17, 2009

(65) Prior Publication Data
US 2009/0236943 A1    Sep. 24, 2009

(30) Foreign Application Priority Data

Mar. 19, 2008 (JP) .................. P2008-071898

(51) Int. Cl.
*H01L 41/187* (2006.01)
(52) U.S. Cl. ....................................... 310/358
(58) Field of Classification Search ............ 310/358
See application file for complete search history.

(56) References Cited

U.S. PATENT DOCUMENTS

| | | | | |
|---|---|---|---|---|
| 2,864,713 A | * | 12/1958 | Lewis | 501/134 |
| 3,231,799 A | * | 1/1966 | Prokopowicz et al. | 361/321.5 |
| 4,862,029 A | * | 8/1989 | Kasai et al. | 310/311 |
| 6,793,843 B2 | * | 9/2004 | Furukawa et al. | 252/62.9 R |
| 7,728,493 B2 | * | 6/2010 | Koizumi et al. | 310/358 |
| 2003/0134738 A1 | * | 7/2003 | Furukawa et al. | 501/135 |
| 2008/0111452 A1 | * | 5/2008 | Koizumi et al. | 310/324 |

FOREIGN PATENT DOCUMENTS

JP    2003-252681    9/2003

OTHER PUBLICATIONS

R. J. Bratton et al., "Phase Transitions in the System $BaTiO_3$-$KNbO_3$," Journal of the American Ceramic Society, Ceramic Abstracts, vol. 50, No. 2, Feb. 1967, pp. 90-93.

* cited by examiner

*Primary Examiner* — Thomas M Dougherty
(74) *Attorney, Agent, or Firm* — Drinker Biddle & Reath LLP

(57) ABSTRACT

The piezoelectric element 20 of the invention comprises a pair of electrodes 2,3 and a piezoelectric ceramic 1 comprising as the major component a solid solution of the two components $KNbO_3$ and $BaTiO_3$. In the solid solution, the molar ratio of $KNbO_3$ is 0.5-0.9 with respect to the total of the two components.

2 Claims, 3 Drawing Sheets

PIEZOELECTRIC CERAMIC AND PIEZOELECTRIC ELEMENT EMPLOYING IT

BACKGROUND OF THE INVENTION

1. Field of the Invention

The present invention relates to a piezoelectric ceramic and to a piezoelectric element employing it.

2. Related Background Art

Known piezoelectric ceramics exhibit piezoelectricity, whereby application of an electric field generates mechanical strain and stress. Such piezoelectric ceramics are used in various types of piezoelectric elements including actuators, piezoelectric buzzers, sounding bodies, sensors and the like.

Actuators employing piezoelectric ceramics characteristically realize high precision to be obtained for fine displacement and produce large generated stress, and they are used for positioning of precision machine tools and optical devices. The piezoelectric ceramics used in actuators are, in most cases, made of lead zirconate titanate (PZT) which has excellent piezoelectric properties. However, because lead zirconate titanate contains a large amount of lead, concerns have been raised in recent years regarding the effects on the environment by elution of lead caused by acid rain. A demand therefore exists for a piezoelectric ceramic material with a satisfactorily reduced lead content, as a substitute for lead zirconate titanate. Various types of lead-free piezoelectric ceramic materials have been proposed to answer this demand.

Barium titanate ($BaTiO_3$), for example, is known as a lead-free piezoelectric ceramic material. Piezoelectric ceramic materials comprising barium titanate ($BaTiO_3$) and other components in solid solution therewith have also been proposed as a means of improving the piezoelectric characteristics of barium titanate. For example, 3-component solid solutions such as $BaTiO_3$—$KNbO_3$—$NaNbO_3$ have been proposed (Japanese Unexamined Patent Publication No. 2003-252681).

It is widely known that solid solutions for piezoelectric ceramics having multiple components in solid solution exhibit high piezoelectric characteristics at the phase boundary (MPB) of crystal structures that exhibit piezoelectricity, such as at the phase boundary between tetragonal and orthorhombic crystals. The compositions around these crystal structure phase boundaries in 2-component or 3-component solid solutions are therefore being actively researched.

The two-component system phase diagram for $BaTiO_3$—$KNbO_3$ shown in FIG. 3 is disclosed in R. J. Bratton, T. Y Tien, J. Am. Ceram. Soc., 50, 90-93 (1967). Specifically, the crystal structure of a two-component solid solution of $BaTiO_3$—$KNbO_3$ has been recognized as non-piezoelectric cubic crystal in a wide compositional ratio, as shown in FIG. 3. This two-component solid solution has therefore not been considered very seriously as a piezoelectric ceramic material. That is, since in the $BaTiO_3$—$KNbO_3$ two-component system shown in FIG. 3, a crystal structure phase boundary has been recognized in compositions with an extremely high proportion of one component and an extremely low proportion of the other component, it has been assumed that piezoelectricity is exhibited only in a biased composition where the proportion of one of the components is extremely high.

SUMMARY OF THE INVENTION

Incidentally, because barium titanate ($BaTiO_3$) has a low Curie temperature (Tc) of about 120° C., a piezoelectric ceramic composed entirely of barium titanate is problematic in that the usable temperature is limited to no higher than 100° C. The hitherto proposed solid solutions of barium titanate and other components have low piezoelectric characteristics compared to lead-based materials and cannot generate sufficiently large displacement. It has therefore been a goal to obtain a piezoelectric ceramic composed of a lead-free material and having satisfactorily excellent piezoelectric characteristics.

The present invention has been accomplished in light of these circumstances, and its object is to provide a piezoelectric ceramic with a sufficiently reduced lead content and with satisfactorily excellent piezoelectric characteristics in a wide temperature range, as well as a piezoelectric element comprising the piezoelectric ceramic.

The present inventors have examined different types of materials with the aim of achieving the object stated above. This has led to the discovery that a two-component solid solution of $KNbO_3$—$BaTiO_3$, which conventionally has been assumed to exhibit no piezoelectricity because of its cubic crystal structure in a wide compositional range, in fact exhibits excellent piezoelectric characteristics in a specific compositional range.

Specifically, the invention provides a piezoelectric ceramic comprising as the major component a solid solution of the two components $KNbO_3$ and $BaTiO_3$, wherein the molar ratio of $KNbO_3$ is 0.5-0.9 with respect to the total of the two components.

Such a piezoelectric ceramic exhibits satisfactorily excellent piezoelectric characteristics within a wide temperature range. The reason for this effect is not thoroughly understood, but the present inventors offer the following conjecture. That is, the crystal structure of a two-component solid solution of $KNbO_3$—$BaTiO_3$ has been believed to be cubic within a wide compositional range. In actuality, however, we believe that a crystal structure phase boundary exists in the compositional range where the molar ratio of $KNbO_3$ is 0.5-0.9. Therefore, a piezoelectric ceramic composed mainly of a solid solution containing these two components in a specific proportion exhibits satisfactorily excellent piezoelectric characteristics in a wide temperature range. Since the piezoelectric ceramic is composed mainly of a solid solution that contains no lead as a structural element, it is also environmentally friendly.

The piezoelectric ceramic of the invention preferably has a relative density of 95% or greater. With such a high relative density it will be possible to obtain even more excellent piezoelectric characteristics.

According to the invention there is also provided a piezoelectric element comprising a pair of electrodes and the aforementioned piezoelectric ceramic between the pair of electrodes. There is further provided a piezoelectric element comprising a body obtained by alternating lamination of internal electrodes and the aforementioned piezoelectric ceramic, and a pair of terminal electrodes that are formed at both edge faces of the body so as to sandwich the body and are electrically connected to the internal electrodes. Such a piezoelectric element comprises a piezoelectric ceramic having such characteristics, and therefore exhibits satisfactorily excellent piezoelectric characteristics in a wide temperature range.

According to the invention it is possible to provide a piezoelectric ceramic with a sufficiently reduced lead content and with satisfactorily excellent piezoelectric characteristics in a wide temperature range, as well as a piezoelectric element comprising the piezoelectric ceramic.

DESCRIPTION OF THE PREFERRED EMBODIMENTS

Preferred embodiments of the invention will now be explained with reference to the accompanying drawings where necessary.

Figure 1:
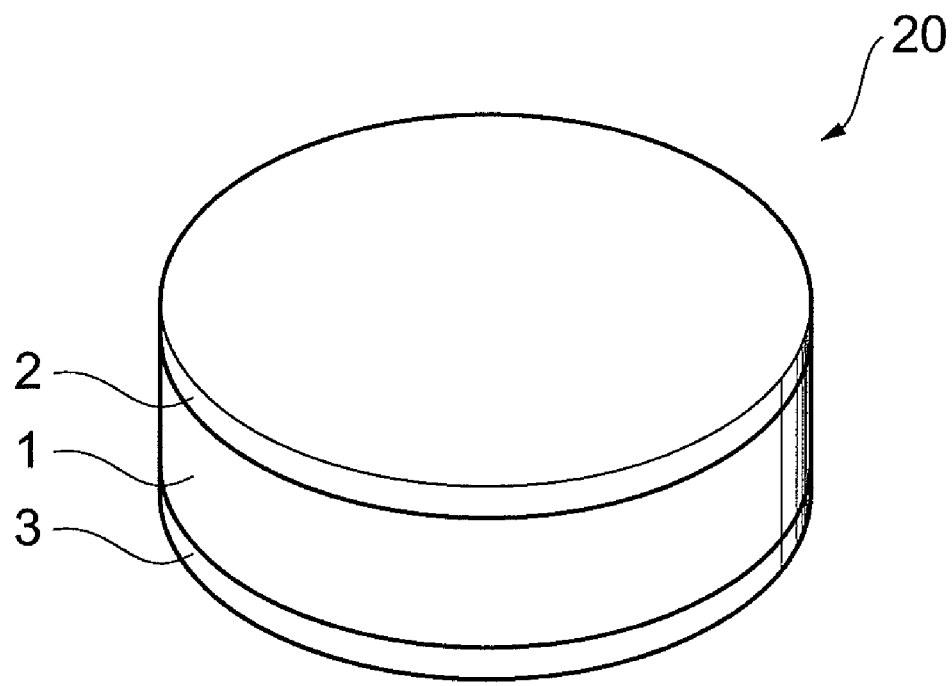
FIG. 1 is a perspective view of an embodiment of a piezoelectric element of the invention.

FIG. 1 is a perspective view of an embodiment of a piezoelectric element of the invention. The piezoelectric element 20 comprises a piezoelectric ceramic 1 and a pair of electrodes 2,3 formed on both surfaces thereof facing the piezoelectric ceramic 1.

The piezoelectric ceramic 1 is polarized in the direction of thickness, i.e. the direction in which the pair of electrodes 2,3 are facing, and application of a voltage between the electrodes 2,3 can produce longitudinal vibration in the thickness direction and vibration diffusing in the radial direction. The electrodes 2,3 are composed of a metal such as gold (Au), for example. An external power source (not shown) may also be electrically connected to the electrodes 2,3 via a wire or the like.

The piezoelectric ceramic 1 comprises, as the major component, a two-component solid solution of KNbO$_3$ and BaTiO$_3$, as represented by the following general formula (1).

$$x\text{KNbO}_3\text{-}(1\text{-}x)\text{BaTiO}_3 \qquad (1)$$

General formula (1) represents a solid solution in which KNbO$_3$ and BaTiO$_3$ are mutually dissolved in the proportion x:(1-x). For this embodiment, x is 0.5-0.9.

Specifically, the piezoelectric ceramic 1 comprises, as the major component, a ceramic which is a solid solution of the complex oxides KNbO$_3$ and BaTiO$_3$, wherein the molar ratio of KNbO$_3$ (x) is 0.5-0.9 with respect to the entire solid solution. The molar ratio is preferably 0.5-0.7 and more preferably 0.5-0.6. A molar ratio of 0.5-0.7 can yield a piezoelectric ceramic with more excellent piezoelectric characteristics.

In a solid solution represented by general formula (1) above, a portion of the Nb may be replaced by Ta, a portion of the Ti may be replaced by Zr and/or Hf, and a portion of the Ba may be replaced by Mg, Ca, Sr.

While the major component of the piezoelectric ceramic 1 is the solid solution represented by general formula (1) above, the content of the solid solution with respect to the entire piezoelectric ceramic 1 is preferably at least 95 wt %, more preferably at least 97 wt % and even more preferably at least 99 wt % from the viewpoint of obtaining even more excellent piezoelectric characteristics.

The composition of the piezoelectric ceramic 1 may be measured by X-ray diffraction or ICP emission spectroscopic analysis, for example. Solid solution of KNbO$_3$ and BaTiO$_3$ can be confirmed by X-ray diffraction, and the molar ratio (x) of KNbO$_3$ and BaTiO$_3$ can be measured by ICP emission spectroscopic analysis.

The piezoelectric ceramic 1 preferably has a relative density of 95% or greater. A piezoelectric ceramic 1 composed of a sintered material having such a high relative density will exhibit even more excellent piezoelectric characteristics. The relative density of the piezoelectric ceramic 1 can be measured by Archimedes' method. The relative density of the piezoelectric ceramic 1 can be adjusted by varying the firing temperature or firing time.

In general formula (1) the oxygen composition is determined stoichiometrically, but an actual composition is permitted to deviate slightly from the stoichiometric composition (for example, to about 95-105 mol % based on the stoichiometric composition).

The piezoelectric ceramic 1 may also contain an Mn compound such as an Mn oxide or a Cu compound such as a Cu oxide, as accessory components. By including an Mn compound or a Cu compound it is possible to improve the electromechanical coupling coefficient (Qm) of the piezoelectric ceramic 1.

The piezoelectric ceramic 1 may contain lead (Pb), but the content is preferably no greater than 1 wt %, and more preferably it contains absolutely no lead. A piezoelectric ceramic with a satisfactorily reduced lead content will release only a minimal amount of lead into the environment by volatilization of lead during firing and upon disposal after it has been distributed on the market as a piezoelectric part, such as a piezoelectric element. Such a piezoelectric ceramic 1 may be suitably used as a material for a vibrating element, sounding body, sensor or the like, and for example, as an actuator serving as a piezoelectric element.

A process for production of the piezoelectric element 20 shown in FIG. 1 will now be explained. First, an oxide powder containing, for example, potassium, niobium, titanium and barium is prepared as the starting material for the main component of the piezoelectric ceramic 1. As the starting materials for accessory components of the piezoelectric ceramic 1 there are prepared, for example, oxides of tantalum, zirconium, hafnium and alkaline earth metals, and an Mn oxide powder and Cu oxide powder. The starting materials used for the main component and accessory components may be, instead of oxides, materials that form oxides upon firing, such as carbonic acid salts or oxalic acid salts.

The starting materials are then sufficiently dried and the potassium compound and niobium compound are weighed out for the composition KNbO$_3$. The compounds are thoroughly mixed in an organic solvent using a ball mill or the like and then dried and fired at 800-1000° C. for 2-12 hours to prepare KNbO$_3$. The prepared KNbO$_3$ is pulverized with a ball mill or the like to a size of no greater than 1 μm to obtain KNbO$_3$ powder.

Separately, the barium compound and titanium compound are weighed out to the composition BaTiO$_3$. The compounds are thoroughly mixed in an organic solvent using a ball mill or the like and then dried and fired at 1000-1300° C. for 2-12 hours to prepare BaTiO$_3$. The prepared BaTiO$_3$ is pulverized with a ball mill or the like to a size of no greater than 1 μm to obtain BaTiO$_3$ powder.

The KNbO$_3$ powder and BaTiO$_3$ powder obtained in this manner are combined in a proportion so that x in general formula (1) above is 0.5-0.9, and the mixture is fired at 700-1000° C. for 2-12 hours. This yields a solid solution comprising KNbO$_3$ and BaTiO$_3$ dissolved in the specific proportion (x=0.5-0.9) represented by general formula (1). When the KNbO$_3$ and BaTiO$_3$ are combined, a metal oxide may also be added if necessary as the starting material for an accessory component.

The solid solution as the weighed out main component and the accessory component starting material added as necessary are thoroughly mixed in an organic solvent or water using a ball mill or the like. The obtained mixture is dried and press molded using a uniaxial pressing machine, cold isostatic press (CIP) or the like and fired at 1000-1200° C. for 2-10 hours. This yields a sintered material composed mainly of the solid solution represented by formula (1) above, i.e. a piezoelectric ceramic. The firing can be carried out in air, for example, and the relative density of the sintered material can be adjusted by varying the firing temperature or firing time.

The obtained sintered body is then worked if necessary, electrodes 2,3 are formed on both surfaces of the sintered body, and an electric field is applied in heated silicone oil for polarization treatment. This yields the piezoelectric ceramic 1 shown in FIG. 1, and a piezoelectric element 20 comprising the piezoelectric ceramic 1 and the electrodes 2,3 formed sandwiching the piezoelectric ceramic 1. The electrodes 2,3 can be formed by coating a paste of Ag (silver) or the like and then drying and firing.

The process for production of the piezoelectric ceramic 1 is not limited to the general ceramic production process described above, and may instead be a hydrothermal synthesis process or sol-gel process.

Another embodiment of a piezoelectric element according to the invention will now be explained.

Figure 2:
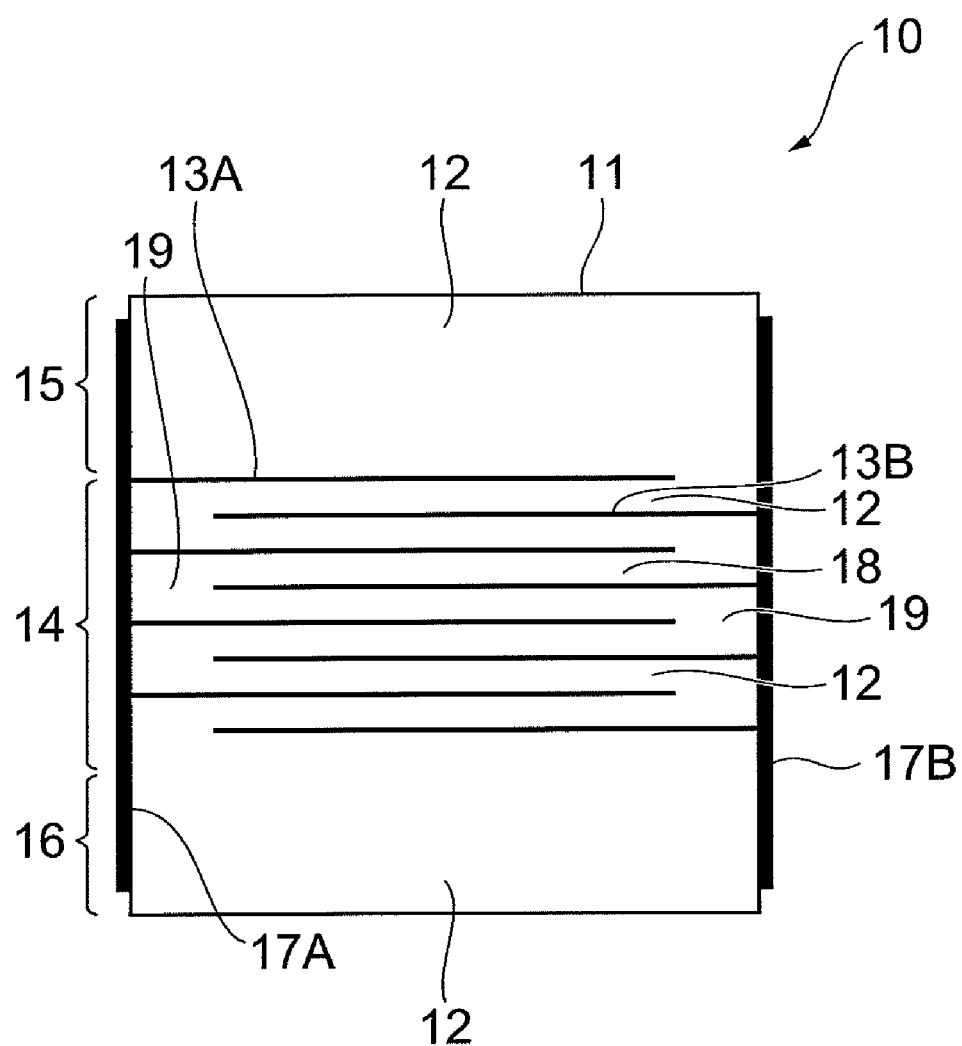
FIG. 2 is a side view of another embodiment of a piezoelectric element of the invention.
Figure 3:
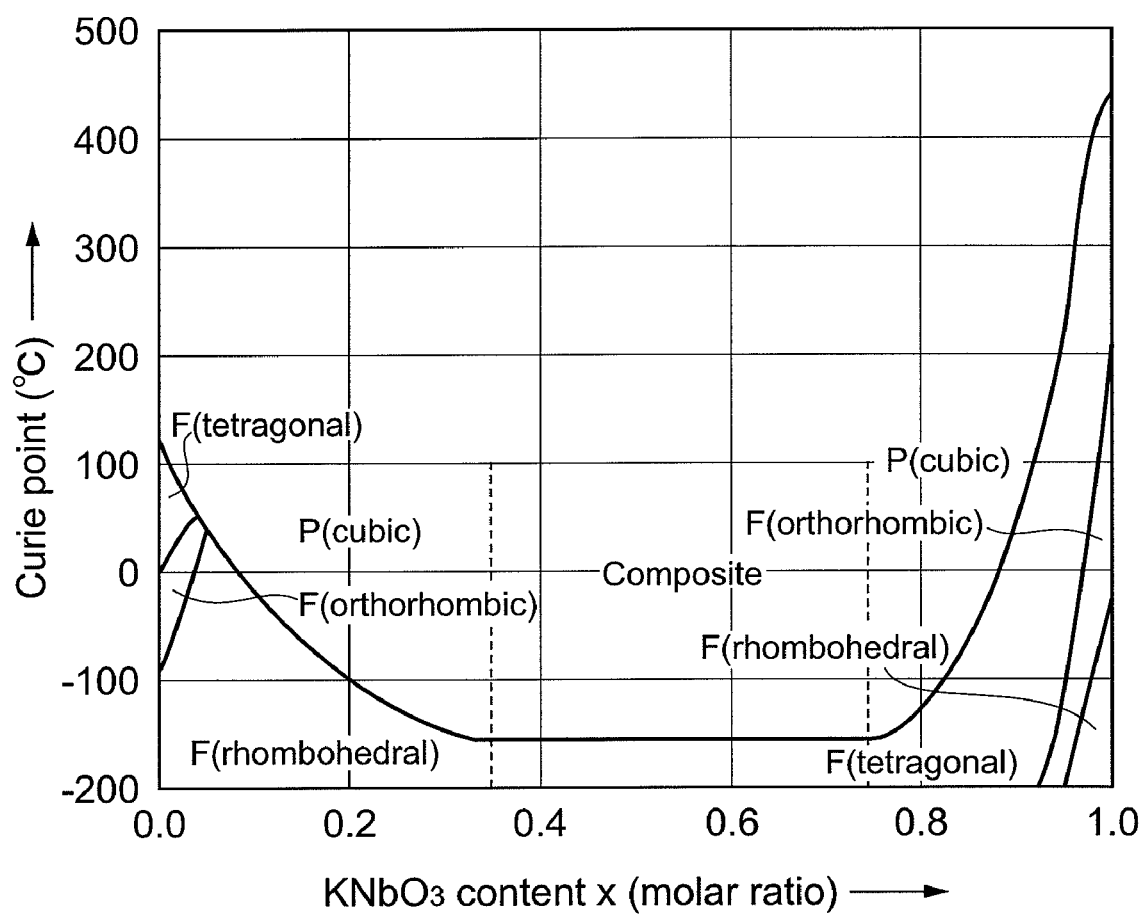
FIG. 3 is a phase diagram for a two-component system of BaTiO$_3$—KNbO$_3$ known in the prior art.

FIG. 2 is a side view of another embodiment of a piezoelectric element of the invention. The stacked piezoelectric element 10 shown in FIG. 2, which is a piezoelectric element in stacked form, comprises a cuboid laminated body 11 and a pair of terminal electrodes 17A, 17B formed on the edges facing the laminated body 11.

The laminated body 11 is composed of a body 14 obtained by alternating lamination of internal electrode layers (electrode layers) 13A, 13B via piezoelectric layers 12, and a pair of protective layers 15 and 16 formed sandwiching the body 14 from both edge faces (above and below in the drawing) in the lamination direction. In the body 14, the piezoelectric layers 12 and internal electrode layers 13A, 13B are alternately laminated.

The piezoelectric layers 12 are layers composed of a piezoelectric ceramic. The piezoelectric ceramic may be the same as the piezoelectric ceramic 1 in the piezoelectric element 20 described above.

The thickness of each piezoelectric layer 12 may be set as desired. For example, the thickness of each piezoelectric layer 12 may be 1-100 μm.

The internal electrode layers 13A, 13B are formed parallel to each other. The internal electrode layer 13A is formed in such a manner that one end is exposed at the edge of the laminated body 11 on which the terminal electrode 17A has been formed. The internal electrode layer 13B is formed in such a manner that one end is exposed at the edge of the laminated body 11 on which the terminal electrode 17B has been formed. The internal electrode layer 13A and internal electrode 13B are situated so that their major sections are stacked in the direction of lamination. The active regions 18 of the piezoelectric layers 12 between the internal electrodes 13A, 13B are the active sections that expand (are displaced) in the direction of lamination when a voltage is applied to the internal electrodes 13A, 13B. The regions 19 that are not between the internal electrodes 13A, 13B are the inactive sections.

The material used for the internal electrode layers 13A, 13B may be, for example, a metal such as Au, Pt, Pd, Ni, Cu or Ag, or an alloy containing two or more of such metals (such as an Ag—Pd alloy). The protective layers 15,16 are composed of a ceramic, and are preferably layers composed of a piezoelectric ceramic. As piezoelectric ceramics for formation of the protective layers 15,16 there may be mentioned the same ones as for the piezoelectric layers 12. The piezoelectric ceramics composing the protective layers 15,16 and piezoelectric layers 12 may be the same or different.

The terminal electrodes 17A, 17B are in contact with the ends of the internal electrodes 13A, 13B exposed at the edge faces of the edges of the laminated body 11 on which they are formed. Electrical connection is thus established between the terminal electrodes 17A, 17B and the internal electrodes 13A, 13B. The terminal electrodes 17A, 17B may be composed of a conductive material consisting mainly of Ag, Au, Cu or the like. The thicknesses of the terminal electrodes 17A, 17B may be appropriately set according to the purpose of use and the size of the stacked piezoelectric element, and for example, they may be 10-50 μm.

A process for production of the stacked piezoelectric element 10 will now be explained. The piezoelectric layers 12 are composed of a piezoelectric ceramic. The piezoelectric ceramic is composed mainly of a solid solution represented by general formula (1) above.

In the process for production of the stacked piezoelectric element 10, first $KNbO_3$ and $BaTiO_3$ are prepared in the same manner as in the process for production of the piezoelectric ceramic 1 described above. The $KNbO_3$ and $BaTiO_3$, and the starting materials for the accessory components that are added as necessary, are subjected to wet grinding with a ball mill or the like, and are then dried to obtain a starting composition powder. Next, an organic binder, organic solvent, organic plasticizer and the like are added to the starting composition powder and mixed for about 20 hours using a ball mill or the like, to obtain a piezoelectric paste.

The piezoelectric paste is coated onto a polyethylene terephthalate (PET) base film by doctor blading, for example, to obtain a piezoelectric green sheet for formation of the piezoelectric layers 12. The piezoelectric green sheet comprises mainly the piezoelectric ceramic starting composition and a binder.

The piezoelectric green sheet is then coated with an electrode paste for formation of the internal electrodes 13A, 13B by a screen printing method or the like, to form an electrode paste layer composed of the electrode paste. A lamination sheet is thus obtained comprising the electrode paste layer on the piezoelectric green sheet. The electrode paste layer is formed into a pattern to obtain the shapes of the aforementioned internal electrodes 13A and 13B.

The electrode paste used to form the electrode paste layer contains a metal such as Au, Pt, Pd, Ni, Cu or Ag, or an alloy of two or more of such metals (Ag—Pd alloy, for example), a binder and an organic solvent. The binder and organic solvent may be publicly known ones. The total content of the metal in the electrode paste is preferably at least 40 wt % and more preferably 50-60 wt %.

Several laminating sheets are then stacked in such a manner that the electrode paste layers and piezoelectric green sheets are alternately situated, and several piezoelectric green sheet layers are further laminated onto the surface of both edge faces in the lamination direction of the laminated structure. The laminated body obtained in this manner is pressed in the lamination direction while heating appropriately, and is cut to the prescribed size if necessary, to obtain a green laminated body (laminated body).

The green laminated body is then set on a stabilized zirconia setter or the like and heated in an air atmosphere for degreasing treatment to remove the binder or organic solvent in the piezoelectric green sheet and electrode paste layer.

Next, the green laminated body from which the binder has been removed is subjected to firing treatment (main firing) by heating in a sealed container (air atmosphere), at 1000-1200° C. for 2-10 hours, for example, to obtain a laminated body 11. The piezoelectric green sheet and electrode paste layer are integrally fired in this main firing treatment, the internal electrodes 13A, 13B are formed from the electrode paste layer, and the piezoelectric layers 12 are formed from the piezoelectric green sheet sandwiched between the internal electrodes 13A, 13B. Also, the protective layers 15,16 are formed from the laminated piezoelectric green sheet on both edge faces in the lamination direction of the green laminated body.

The terminal electrodes 17A, 17B are then baked onto the mutually opposing edge faces that are parallel in the lamination direction of the obtained laminated body 11 (the edge faces where the internal electrode 13A, 13B terminals are exposed). Specifically, a terminal electrode-forming paste containing the metal for the terminal electrodes 17A, 17B, the organic binder and other components is coated onto the aforementioned edge faces of the laminated body 11 and then fired to form the terminal electrodes 17A, 17B. This produces a stacked piezoelectric element 10 having the structure shown in FIG. 2. The terminal electrodes 17A, 17B can also be formed by a method such as sputtering, vapor deposition, electroless plating or the like, instead of the baking method described above.

Also, the stacked piezoelectric element 10 may be subjected to polarization treatment wherein a voltage is applied between the terminal electrodes 17A, 17B for about 10-30 minutes to an electric field strength of 2-5 kV/mm in an environment of room temperature to 120° C., to obtain a stacked piezoelectric element 10 that functions as a piezoelectric actuator.

The embodiment described above is only a preferred embodiment of the invention, and the invention is in no way limited thereto.

EXAMPLES

The present invention will now be explained in greater detail based on examples and comparative examples, with the understanding that these examples are in no way limitative on the invention.

Example 1

Fabrication of Piezoelectric Element

A piezoelectric element 20 such as shown in FIG. 1 was fabricated by the following procedure. First, $K_2CO_3$ powder and $Nb_2O_5$ powder were prepared as starting materials for $KNbO_3$, and the starting materials were thoroughly dried. The dried $K_2CO_3$ powder and $Nb_2O_5$ powder were then weighed out in amounts matching the composition for $KNbO_3$ (K:Nb=1:1 (molar ratio)).

The weighed out $K_2CO_3$ powder and $Nb_2O_5$ powder were thoroughly mixed in ethanol using a ball mill, dried and fired at 800-1000° C. for 2 hours-12 hours to prepare $KNbO_3$. The prepared $KNbO_3$ was pulverized with a ball mill to obtain $KNbO_3$ powder with a particle size of no greater than 1 μm.

$BaCO_3$ powder and $TiO_2$ powder were prepared as a starting materials for $BaTiO_3$, and the starting materials were thoroughly dried. The dried $BaCO_3$ powder and $TiO_2$ powder were then weighed out in amounts matching the composition for $BaTiO_3$ (Ba:Ti=1:1 (molar ratio)).

The weighed out $BaCO_3$ powder and $TiO_2$ powder were thoroughly mixed in purified water using a ball mill, and then dried and fired at 1000° C.-1300° C. for 2 hours-12 hours to prepare $BaTiO_3$. The prepared $BaTiO_3$ was pulverized with a ball mill to obtain $BaTiO_3$ powder with a particle size of no greater than 1 μm.

The $KNbO_3$ powder and $BaTiO_3$ powder obtained in this manner were mixed to a molar ratio of 0.5:0.5 to prepare a mixed powder. The mixed powder was calcined at 900° C. for 10 hours. Polyvinyl alcohol (PVA) was added to the calcined powder, and pellets were prepared by uniaxial molding. The binder was removed from the pellets, and firing was carried out in a closed system under firing conditions with a temperature of 1160° C. for 2 hours to obtain a sintered body.

The obtained sintered body was polished and cut, gold electrodes were formed by sputtering on the opposite surfaces of the sintered body, and polarization treatment was carried out under conditions of 50° C., 15 minutes, 3 kV/mm direct current. This procedure yielded the piezoelectric element 20 shown in FIG. 1.

<Evaluation of Piezoelectric Element>
[Measurement of Piezoelectric Constant]

A voltage of 2 kV/mm was applied to the obtained piezoelectric element 20 with a displacement gauge (trade name: 1202IC by Mahr), and the displacement was measured. The piezoelectric constant $d_{33}$ was calculated from the measured displacement. The results are shown in Table 1.

[Measurement of Curie Temperature]

After setting the piezoelectric element 20 in an electric furnace, an LCR meter was used for measurement of the temperatures at which the electrostatic capacity of the piezoelectric element was maximum during temperature increase and temperature decrease, and the Curie temperature Tc was determined from their average value. The results are shown in Table 1. Generally speaking, piezoelectric elements with a higher Curie temperature Tc exhibit piezoelectric characteristics at higher temperatures.

[Measurement of Relative Density]

The relative density of the obtained piezoelectric element 20 was determined by Archimedes' method. The results are shown in Table 1.

Example 2

A mixed powder was prepared in the same manner as Example 1, except that during preparation of the mixed powder comprising $KNbO_3$ powder and $BaTiO_3$ powder, the molar ratio of the $KNbO_3$ powder and $BaTiO_3$ powder was changed as shown in Table 1. The mixed powder was calcined at 900° C. for 10 hours. Polyvinyl alcohol (PVA) was added to the calcined powder, and pellets were prepared by uniaxial molding. The binder was removed from the pellets, and firing was carried out in a closed system under firing conditions with a temperature of 1150° C. for 2 hours to obtain a sintered body.

The obtained sintered body was polished and cut, gold electrodes were formed by sputtering on the opposite surfaces of the sintered body, and polarization treatment was carried out under conditions of 50° C., 15 minutes, 3 kV/mm direct current. This procedure yielded a piezoelectric element. The piezoelectric element was evaluated in the same manner as Example 1. The evaluation results are shown in Table 1.

Example 3

A mixed powder was prepared in the same manner as Example 1, except that during preparation of the mixed powder comprising $KNbO_3$ powder and $BaTiO_3$ powder, the molar ratio of the $KNbO_3$ powder and $BaTiO_3$ powder was changed as shown in Table 1. The mixed powder was calcined at 900° C. for 10 hours. Polyvinyl alcohol (PVA) was added to the calcined powder, and pellets were prepared by uniaxial molding. The binder was removed from the pellets, and firing was carried out in a closed system under firing conditions with a temperature of 1140° C. for 2 hours to obtain a sintered body.

The obtained sintered body was polished and cut, gold electrodes were formed by sputtering on the opposite surfaces of the sintered body, and polarization treatment was carried out under conditions of 50° C., 15 minutes, 3 kV/mm direct current. This procedure yielded a piezoelectric element. The piezoelectric element was evaluated in the same manner as Example 1. The evaluation results are shown in Table 1.

Example 4

A mixed powder was prepared in the same manner as Example 1, except that during preparation of the mixed powder comprising $KNbO_3$ powder and $BaTiO_3$ powder, the molar ratio of the $KNbO_3$ powder and $BaTiO_3$ powder was changed as shown in Table 1. The mixed powder was calcined at 900° C. for 10 hours. Polyvinyl alcohol (PVA) was added to the calcined powder, and pellets were prepared by uniaxial molding. The binder was removed from the pellets, and firing was carried out in a closed system under firing conditions with a temperature of 1130° C. for 2 hours to obtain a sintered body.

The obtained sintered body was polished and cut, gold electrodes were formed by sputtering on the opposite surfaces of the sintered body, and polarization treatment was carried out under conditions of 50° C., 15 minutes, 4 kV/mm direct current. This procedure yielded a piezoelectric element. The piezoelectric element was evaluated in the same manner as Example 1. The evaluation results are shown in Table 1.

Example 5

A mixed powder was prepared in the same manner as Example 1, except that during preparation of the mixed powder comprising $KNbO_3$ powder and $BaTiO_3$ powder, the molar ratio of the $KNbO_3$ powder and $BaTiO_3$ powder was changed as shown in Table 1. The mixed powder was calcined at 900° C. for 10 hours. Polyvinyl alcohol (PVA) was added to the calcined powder, and pellets were prepared by uniaxial molding. The binder was removed from the pellets, and firing was carried out in a closed system under firing conditions with a temperature of 1120° C. for 2 hours to obtain a sintered body.

The obtained sintered body was polished and cut, gold electrodes were formed by sputtering on the opposite surfaces of the sintered body, and polarization treatment was carried out under conditions of 50° C., 15 minutes, 4 kV/mm direct current. This procedure yielded a piezoelectric element. The piezoelectric element was evaluated in the same manner as Example 1. The evaluation results are shown in Table 1.

Comparative Examples 1-3

A mixed powder was prepared in the same manner as Example 1, except that during preparation of the mixed powder comprising $KNbO_3$ powder and $BaTiO_3$ powder, the molar ratio of the $KNbO_3$ powder and $BaTiO_3$ powder was changed as shown in Table 1. For Comparative Example 1, $BaTiO_3$ powder was used alone. The mixed powder or $BaTiO_3$ powder was calcined at 900° C. for 10 hours. Polyvinyl alcohol (PVA) was added to the calcined powder, and pellets were prepared by uniaxial molding. The binder was removed from the pellets, and firing was carried out in a closed system under firing conditions with a temperature of 1350° C. for 2 hours to obtain a sintered body.

The obtained sintered body was polished and cut, gold electrodes were formed by sputtering on the opposite surfaces of the sintered body, and polarization treatment was carried out under conditions of 50° C., 30 minutes, 1 kV/mm direct current. This procedure yielded a piezoelectric element. The piezoelectric element was evaluated in the same manner as Example 1. The evaluation results are shown in Table 1.

Comparative Example 4

A mixed powder was prepared in the same manner as Example 1, except that during preparation of the mixed powder comprising $KNbO_3$ powder and $BaTiO_3$ powder, the molar ratio of the $KNbO_3$ powder and $BaTiO_3$ powder was changed as shown in Table 1. The mixed powder was calcined at 900° C. for 10 hours. Polyvinyl alcohol (PVA) was added to the calcined powder, and pellets were prepared by uniaxial molding. The binder was removed from the pellets, and firing was carried out in a closed system under firing conditions with a temperature of 1266° C. for 2 hours to obtain a sintered body.

The obtained sintered body was polished and cut, gold electrodes were formed by sputtering on the opposite surfaces of the sintered body, and polarization treatment was carried out under conditions of 50° C., 30 minutes, 2 kV/mm direct current. This procedure yielded a piezoelectric element. The piezoelectric element was evaluated in the same manner as Example 1. The evaluation results are shown in Table 1.

Comparative Example 5

A mixed powder was prepared in the same manner as Example 1, except that during preparation of the mixed powder comprising $KNbO_3$ powder and $BaTiO_3$ powder, the molar ratio of the $KNbO_3$ powder and $BaTiO_3$ powder was changed as shown in Table 1. The mixed powder was calcined at 900° C. for 10 hours. Polyvinyl alcohol (PVA) was added to the calcined powder, and pellets were prepared by uniaxial molding. The binder was removed from the pellets, and firing was carried out in a closed system under firing conditions with a temperature of 1213° C. for 2 hours to obtain a sintered body.

The obtained sintered body was polished and cut, gold electrodes were formed by sputtering on the opposite surfaces of the sintered body, and polarization treatment was carried out under conditions of 50° C., 15 minutes, 2 kV/mm direct current. This procedure yielded a piezoelectric element. The piezoelectric element was evaluated in the same manner as Example 1. The evaluation results are shown in Table 1.

Comparative Example 6

A mixed powder was prepared in the same manner as Example 1, except that $KNbO_3$ powder was used instead of the mixture of $KNbO_3$ powder and $BaTiO_3$ powder. The mixed powder was calcined at 900° C. for 10 hours. Polyvinyl alcohol (PVA) was added to the calcined powder, and pellets were prepared by uniaxial molding. The binder was removed from the pellets, and firing was carried out in a closed system under firing conditions with a temperature of 1045° C. for 2 hours to obtain a sintered body.

The obtained sintered body was polished and cut, gold electrodes were formed by sputtering on the opposite surfaces of the sintered body, and polarization treatment was carried out under conditions of 50° C., 15 minutes, 4 kV/mm direct current. This procedure yielded a piezoelectric element. The piezoelectric element was evaluated in the same manner as Example 1. The evaluation results are shown in Table 1.

TABLE 1

| | Solid solution composition (*1) | $d_{33}$ (pm/V) | Tc (° C.) | Relative density (%) |
|---|---|---|---|---|
| Example 1 | $0.5KNbO_3$—$0.5BaTiO_3$ | 260 | 427 | 95.3 |
| Example 2 | $0.6KNbO_3$—$0.4BaTiO_3$ | 231 | 429 | 95.8 |
| Example 3 | $0.7KNbO_3$—$0.3BaTiO_3$ | 223 | 431 | 96.6 |
| Example 4 | $0.8KNbO_3$—$0.2BaTiO_3$ | 208 | 432 | 97.1 |
| Example 5 | $0.9KNbO_3$—$0.1BaTiO_3$ | 192 | 432 | 97.8 |
| Comp. Ex. 1 | $BaTiO_3$ | 306 | 125 | 97.9 |
| Comp. Ex. 2 | $0.1KNbO_3$—$0.9BaTiO_3$ | 141 | 127 | 97.6 |
| Comp. Ex. 3 | $0.2KNbO_3$—$0.8BaTiO_3$ | 139 | 130 | 95.2 |
| Comp. Ex. 4 | $0.3KNbO_3$—$0.7BaTiO_3$ | 144 | 131 | 94.5 |
| Comp. Ex. 5 | $0.4KNbO_3$—$0.6BaTiO_3$ | 153 | 130 | 95.5 |
| Comp. Ex. 6 | $KNbO_3$ | 130 | 435 | 94.3 |

(*1) The numerical values in Examples 1-5 and Comp. Exs. 2-5 represent the molar ratios of each compound.

As shown in Table 1, when the proportion of $KNbO_3$ was 0.5-0.9 with respect to the total of $KNbO_3$ and $BaTiO_3$ in the solid solution comprising $KNbO_3$ and $BaTiO_3$, excellent piezoelectric characteristics were confirmed in a wide temperature range.

What is claimed is:

1. A piezoelectric element comprising
a body obtained by alternating lamination of internal electrodes and a piezoelectric ceramic comprising as the major component a solid solution of the two components $KNbO_3$ and $BaTiO_3$, wherein the molar ratio of $KNbO_3$ is 0.5-0.9 with respect to the total of the two components, and
a pair of terminal electrodes that are formed at both edges of the body so as to sandwich the body and are electrically connected to the internal electrodes.

2. The piezoelectric element according to claim 1, wherein the relative density is 95% or greater.

* * * * *